(12) United States Patent
Yanagisawa

(10) Patent No.: US 7,747,111 B2
(45) Date of Patent: Jun. 29, 2010

(54) OPTICAL WAVEGUIDE MOUNTED SUBSTRATE AND METHOD OF PRODUCING THE SAME

(75) Inventor: Kenji Yanagisawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 12/208,792

(22) Filed: Sep. 11, 2008

(65) Prior Publication Data

US 2009/0074353 A1 Mar. 19, 2009

(30) Foreign Application Priority Data

Sep. 14, 2007 (JP) ............... 2007-239820

(51) Int. Cl.
  *G02B 6/00* (2006.01)
  *G02B 6/12* (2006.01)
(52) U.S. Cl. ........................ 385/14; 385/141
(58) Field of Classification Search .............. 385/14, 385/141; 438/31–35
  See application file for complete search history.

(56) References Cited

U.S. PATENT DOCUMENTS

| 5,488,678 | A | * | 1/1996 | Taneya et al. ............ 385/14 |
| 5,712,188 | A | * | 1/1998 | Chu et al. ............. 438/40 |
| 5,760,479 | A | * | 6/1998 | Yang et al. .............. 257/778 |
| 6,316,281 | B1 | * | 11/2001 | Lee et al. ............. 438/31 |
| 6,438,281 | B1 | * | 8/2002 | Tsukamoto et al. ...... 385/14 |
| 6,661,939 | B2 | * | 12/2003 | Kaneko et al. .......... 385/14 |
| 2009/0074354 | A1 | | 3/2009 | Yanagisawa |
| 2009/0133444 | A1 | * | 5/2009 | Kim et al. ............ 65/386 |

FOREIGN PATENT DOCUMENTS

| JP | 2546688 | 8/1996 |
| JP | 2003-227951 | 8/2003 |

\* cited by examiner

*Primary Examiner*—Akm E Ullah
(74) *Attorney, Agent, or Firm*—Drinker Biddle & Reath LLP

(57) ABSTRACT

Openings are disposed in an insulating layer to expose a conductor layer. A lower cladding layer is formed, and a resist layer is formed on an insulating layer and the lower cladding layer. Electrolytic plating is performed with using the conductor layer which is connected to the external, as an electrode, to fill openings passing through the lower cladding layer and the resist layer with Cu. The resist layer is removed away to form projections configured by the filled Cu. The projections are processed to have an inclined face. Au layers are formed on the inclined faces of the projection. A core layer and an upper cladding layer are stacked.

9 Claims, 4 Drawing Sheets

FIG. 1    Prior Art
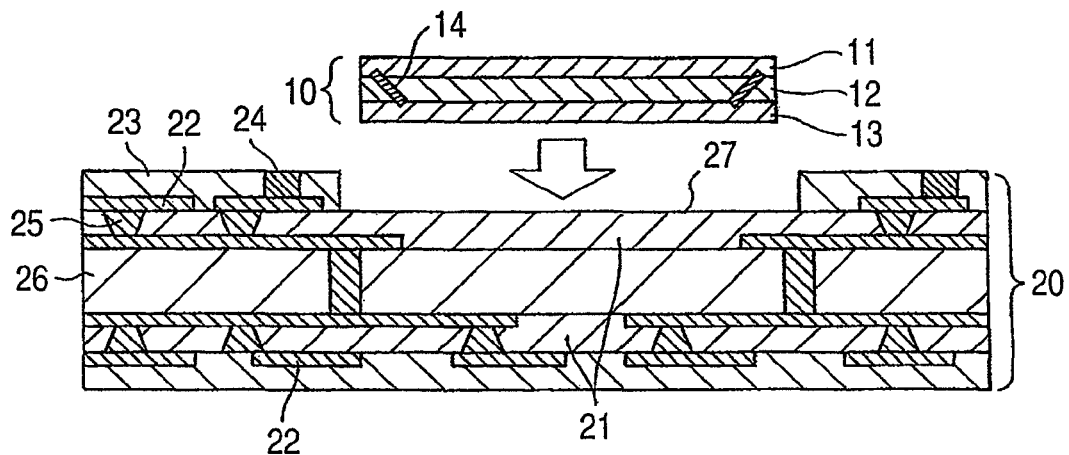
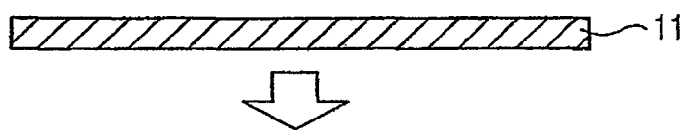
FIG. 2A   Prior Art
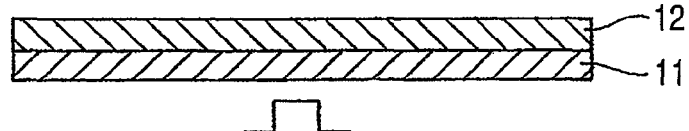
FIG. 2B   Prior Art
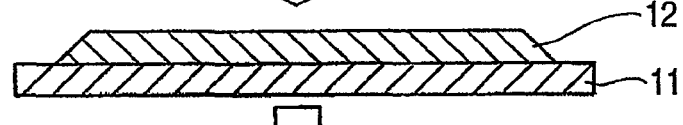
FIG. 2C   Prior Art
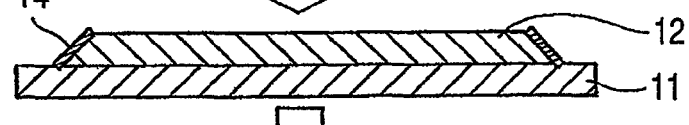
FIG. 2D   Prior Art
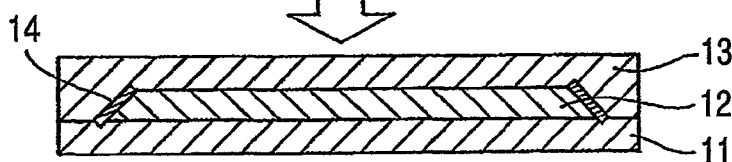
FIG. 2E   Prior Art

OPTICAL WAVEGUIDE MOUNTED SUBSTRATE AND METHOD OF PRODUCING THE SAME

TECHNICAL FIELD

The present disclosure relates to an optical waveguide mounted substrate which is used in photoelectric conversion of signal transmission, such as an opto-electric package or an opto-electric substrate, and a method of producing such an optical waveguide mounted substrate.

RELATED ART

As an optical communication device, a laser emitting device (VCSEL) is mainly used. In the case where such a device and a light receiving device (PD) are flip-chip mounted on a substrate or the like, light is perpendicularly emitted from the device toward the surface of the substrate.

Therefore, a method is employed in which light is reflected at 90 degrees by an inclined mirror so that the light emission direction is parallel to the substrate plane.

In related-art production of an opto-electric composite substrate, an electrical circuit substrate and an optical waveguide are separately produced, and these components are then combined with each other. The inclined mirror is previously produced by a method in which a mirror is formed on an optical waveguide or a fiber, or a pre-completed mirror component is mounted on a substrate.

FIGS. 1 and 2 show a related-art optical waveguide mounted substrate and a method of producing the substrate, in which a 45-degree inclined reflecting mirror is formed on an optical waveguide, and then the optical waveguide is mounted on an electrical circuit substrate. In the related-art shown in FIG. 1, an optical waveguide 10 is formed by performing a 45-degree dicer cut and cut surface leveling (excimer laser processing or the like), die molding, or vapor deposition of a metal (such as Au), and then mounted on an electrical circuit substrate 20.

Referring to FIG. 2, (1) an upper cladding layer 11 is cured (FIG. 2A), (2) a core layer 12 is stacked on the upper cladding layer 11, and then subjected to patterning, developing, and curing processes (FIG. 2B), (3) both end portions of the core layer 12 are inclinedly processed at 45 degrees by a dicer cut or the like to form inclination portions (FIG. 2C), (4) mirrors 14 are formed on the inclination portions of the 45-degree processed core layer 12 by, for example, vapor deposition of Au (FIG. 2D), and (5) a lower cladding layer 13 is stacked and cured on both end portions of the upper cladding layer 11 and the core layer 12 including the portions of the mirrors 14 (FIG. 2E). The upper cladding layer 11 and the lower cladding layer 13 are made of the same material and integrated with each other as a result of the stacking step.

The optical waveguide 10 including the upper cladding layer 11, core layer 12, lower cladding layer 13, and 45-degree inclined mirrors 14 which are formed as described above is mounted on the electrical circuit substrate 20 as shown in FIG. 1. The electrical circuit substrate 20 has a recess 27 for mounting the optical waveguide 10. The optical waveguide 10 is mounted in the recess 27 in the direction of the arrow to constitute an optical waveguide mounted electric circuit substrate.

The electrical circuit substrate 20 of FIG. 1 comprises a resin layer 21, a circuit pattern 22 made of Cu, a solder resist 23, a solder land 24, a via 25 connecting the circuit patterns (or a through-hole via), and a core substrate 26.

As a related art technique relating to an electrical circuit substrate comprising an optical waveguide, the following techniques have been proposed.

According to Patent Reference 1, a strip-like optical waveguide is disposed in a surface portion of an optical waveguide substrate. Recesses which are opened to the surface side are formed on the side of the substrate in both end portions of the optical waveguide. A reflecting wall which is inclined at 45 degrees to the optical axis of the optical waveguide, and which is directed in an obliquely upward direction is configured in substrate-side portions opposed to the both end faces of the optical waveguide. Therefore, light which is perpendicularly incident to the optical waveguide substrate is reflected at an angle of 90 degrees by one of the 45-degree inclined reflecting walls to be incident on one end of the optical waveguide. Light which is emitted from the other end of the optical waveguide is reflected at an angle of 90 degrees by the other 45-degree inclined reflecting wall of the optical waveguide to be emitted perpendicularly to the optical waveguide substrate.

Patent Reference 2 discloses an optical waveguide device in which an optical device is mounted so as to be optically coupled with an optical waveguide sheet. In order to eliminate the necessity for an alignment work, guiding means for disposing and fixing the optical device in a predetermined posture is disposed in the optical waveguide sheet.

[Patent Reference 1] Japanese Patent No. 2,546,688

[Patent Reference 2] Japanese Patent Unexamined Application Publication No. 2003-227951

In the related-art optical waveguide mounted substrate and method of producing the substrate which are shown in FIGS. 1 and 2, the method in which the electrical circuit substrate and the optical waveguide (mirror component) are separately produced, and the optical waveguide is then mounted on the electrical circuit substrate is employed. Therefore, the processes of producing the electrical circuit substrate, producing the optical waveguide (mirror component), and mounting the optical waveguide on the electrical circuit substrate must be separately conducted, thereby causing problems of the working efficiency and the production cost. Moreover, special means for positioning and mounting the optical waveguide on an adequate position of the electrical circuit substrate is required.

A method in which, in place of the separate production of the electrical circuit substrate and the optical waveguide, the optical waveguide is produced as extension of the production of the electrical circuit substrate may be employed. However, in this case, the structure of the 45-degree inclined reflecting mirror and the production process cause bottlenecks.

Among the related art techniques, in the configuration disclosed in Patent Reference 1, light which is perpendicularly incident to the optical waveguide substrate is reflected at every 90 degrees by the two 45-degree inclined reflecting walls which are disposed respectively on the both sides, so as to be emitted perpendicularly to the optical waveguide substrate. However, the optical waveguide is not formed as extension of the production of the electrical circuit substrate.

In the device of Patent Reference 2, although the guiding means for mounting the optical device so as to be optically coupled with the optical waveguide sheet is disposed, the optical waveguide is not formed as extension of the production of the electrical circuit substrate.

SUMMARY

Exemplary embodiments of the present invention provide an optical waveguide mounted substrate and a method of producing the optical waveguide mounted substrate.

An exemplary embodiment according to the invention is a method of producing an optical waveguide mounted substrate comprising an electrical circuit substrate and an optical waveguide formed on the electrical circuit substrate, the electrical circuit substrate having an insulating layer positioned at its surface and a conductor layer below the insulating layer, the method comprising steps of:

forming at least one opening in the insulating layer to expose the conductor layer;

forming a lower cladding layer on the insulating layer, the lower cladding layer having an opening at a position corresponding to the opening of the insulating layer;

forming a resist layer on the lower cladding layer, and forming an opening at a position of the resist layer corresponding to the opening of the insulating layer;

performing electrolytic plating with using the conductor layer which is exposed through the openings, as an electrode, to fill the openings with a metal, the openings passing through the insulating layer, the lower cladding layer, and the resist layer;

removing the resist layer to form a projection configured by the filled metal;

processing the projection to have an inclined face;

forming a reflecting layer on the inclined face of the projection;

stacking a core layer on the lower cladding layer and the reflecting layer; and stacking an upper cladding layer on the core layer.

In this case, the projection may be formed by the electrolytic plating using Cu, the reflecting layer may be formed by Au, and the projection may be processed into an angle of 45 degrees to a surface of the electrical circuit substrate.

Moreover, an exemplary embodiment according to the invention is an optical waveguide mounted substrate comprising:

an electrical circuit substrate; and an optical waveguide formed on the electrical circuit substrate, wherein the optical waveguide includes a lower cladding layer formed on a surface of the electrical circuit substrate, a core layer stacked on the lower cladding layer, an upper cladding layer stacked on the core layer, and at least one inclined reflecting mirror formed in the core layer, the reflecting mirror having a metal layer formed on an inclined face of a projection made of metal formed in the optical waveguide, the metal layer being made of different metal from the projection.

In this case, the reflecting mirror may be inclined at 45 degrees to the optical waveguide. The metal layer may be made of Au, and the projection may be made of Cu.

The reflecting mirror may comprise two reflecting mirrors disposed in the vicinities of both ends of the optical waveguide. The optical waveguide mounted substrate may further comprise:

a light emitting device having a light emitting portion and being disposed on the electrical circuit substrate; and a light receiving device having a light receiving portion and being disposed on the electrical circuit substrate, wherein an optical axis of the light emitting portion is perpendicular to an optical path defined by the upper and lower cladding layers of the optical waveguide, and the optical axis of the light emitting portion forms an angle of 45 degrees with respect to one of the reflecting mirrors, and wherein an optical axis of the light receiving portion is perpendicular to the optical path of the optical waveguide, and the optical axis of the light receiving portion forms an angle of 45 degrees with respect to the other of the reflecting mirrors.

The reflecting mirror may be disposed only in the vicinity of one end of the optical waveguide. The optical waveguide mounted substrate may further comprise:

a light emitting device having a light emitting portion and being disposed on the electrical circuit substrate, wherein an optical axis of the light emitting portion is perpendicular to an optical path defined by the upper and lower cladding layers of the optical waveguide, and the optical axis of the light emitting portion forms an angle of 45 degrees with respect to the reflecting mirror.

According to the exemplary embodiments of invention, as means for optical transmission, a reflecting mirror (for example, 45-degree inclined reflecting mirror) is formed on an electrical circuit substrate in extension of the production of the electrical circuit substrate. Therefore, the necessity for disposing the reflecting mirror structure in an optical waveguide is eliminated and the formation of the reflecting mirror for optical transmission is facilitated and the structure of the optical waveguide is simplified. According to the configuration, the optical waveguide can be formed on the electrical circuit substrate as extension of the production of the electrical circuit substrate. In the optical waveguide mounted substrate, the electrical circuit substrate and the optical waveguide, which are separately produced in the related art, can be collectively produced in extension of the production of the electrical circuit substrate. The number of man-hours and the production cost can be reduced.

Other features and advantages may be apparent from the following detailed description, the accompanying drawings and the claims.

BRIEF DESCRIPTION OF THE DRAWINGS

FIG. 1 shows a section view showing a related art example in which an optical waveguide is mounted on an electrical circuit substrate.

FIGS. 2A to 2E show a related art example in which 45-degree inclined reflecting mirrors are formed in an optical waveguide, in a sequence of steps.

DETAILED DESCRIPTION

Figure 3A:
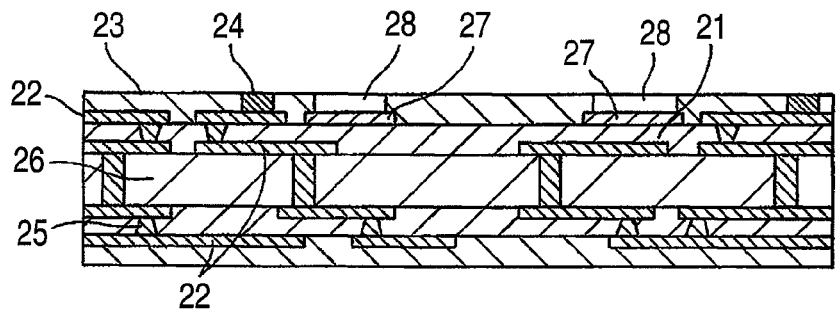
FIGS. 3A to 3E show steps of a method (first half steps) of producing an optical waveguide mounted substrate of the invention.

Hereinafter, embodiments of the invention will be described in detail with reference to the accompanying drawings.

FIGS. 3 and 4 show sequential steps of a method of producing an optical waveguide mounted substrate of an embodiment of the invention. FIG. 3A is a section view of a multilayer electrical circuit substrate. The electrical circuit substrate shown in FIG. 3A comprises an insulating resin layer 21, a circuit pattern 22 made of Cu, a solder resist 23, a solder land 24, a via 25 connecting the circuit patterns (or a through-hole via), and an insulating core substrate 26 made of a material such as FR-4.

An insulating layer positioned at the surface of the electrical circuit substrate in which an optical waveguide is to be formed is configured by a face of the flat solder resist 23. The face of the solder resist 23 has an area required for forming an optical waveguide. In the embodiment, a conductor layer 27 which is made of Cu, and which is electrically connectable with the outside of the substrate is formed as the underlayer of the solder resist 23. The conductor layer 27 will function as an electrode in an electrolytic plating process which is to be performed later. Openings 28 are formed in the solder resist 23 which is on the conductor layer 27. The openings 28 are disposed at positions corresponding to those where inclined reflecting mirrors (in the embodiment, 45-degree inclined reflecting mirrors) are to be formed in a later step.

Figure 3B:
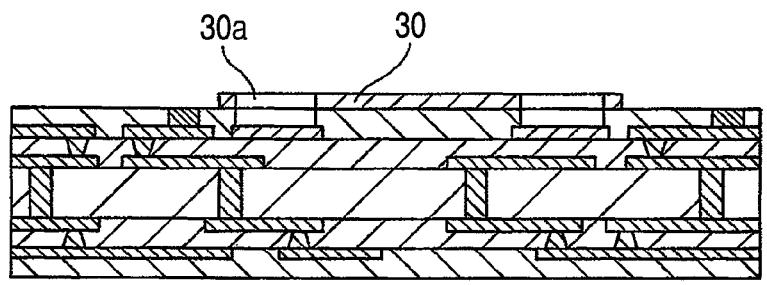

First, a lower cladding layer 30 of the optical waveguide is stacked on the face of the solder resist 23 as shown in FIG. 3B. The thickness of the lower cladding layer 30 is about 10 μm. The lower cladding layer 30 is patterned and developed by well known methods, so as to form openings 30a at positions corresponding to the openings 28 of the solder resist 23.

Figure 3C:
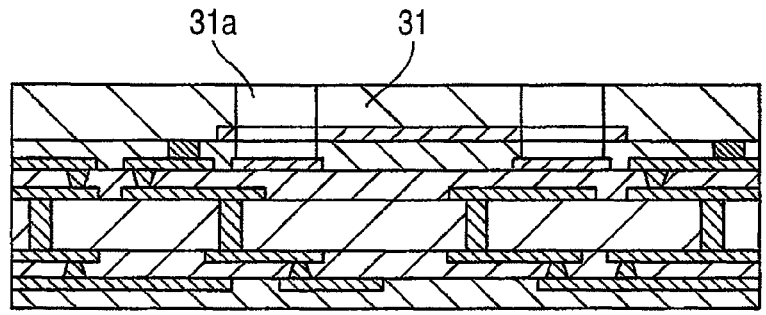

As shown in FIG. 3C, next, a dry film is formed as a resist layer 31 on the solder resist 23 of the electrical circuit substrate and the lower cladding layer 30. The thickness of the dry film 31 is about 35 μm. Also the dry film 31 is patterned and developed by well known methods, so as to form openings 31a at positions corresponding to the openings 28 of the solder resist 23 and the openings 30a of the lower cladding layer 30.

Figure 3D:
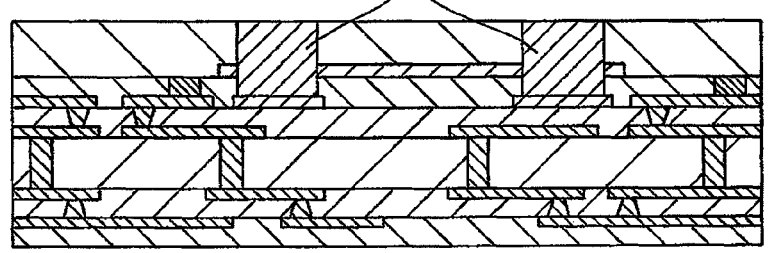

Referring to FIG. 3D, next, electrolytic plating is performed with using the conductor layer 27 which is exposed through the openings 28, 30a, 31a, as an electrode, whereby the openings 28, 30a, 31a passing through the solder resist 23 which is the insulating layer positioned at the surface of the electrical circuit substrate, the lower cladding layer 30, and the resist layer 31 are filled with a metal such as Cu to a height required for forming the 45-degree inclined reflecting mirror.

In the case where an optical waveguide 10 to be formed is configured so that light which is perpendicularly incident to the electrical circuit substrate is passed through the optical waveguide and then emitted perpendicularly to the electrical circuit substrate or in a direction by 180 degrees to the light incident on the electrical circuit substrate, the 45-degree inclined reflecting mirror of the optical waveguide is formed in two places. In this case, therefore, there are two places where the 45-degree inclined reflecting mirrors are formed, and also the openings 28, 30a, 31a are formed in two places. As described later, there is a case where the 45-degree inclined reflecting mirror of the optical waveguide is formed only in one place.

Figure 3E:
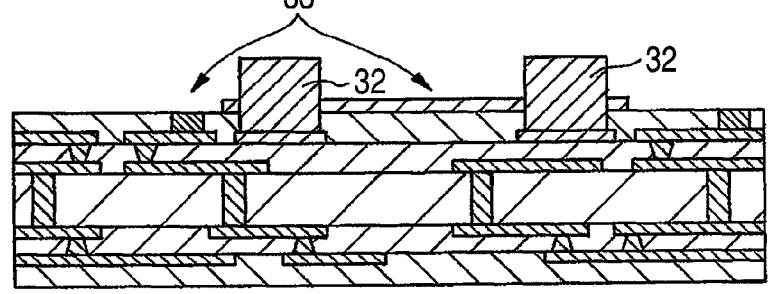

Referring to FIG. 3E, next, the resist layer 31 is removed, so that projections 32, 32 of the metal (Cu) remain in the two places where the 45-degree inclined reflecting mirrors are to be formed.

Figure 4A:
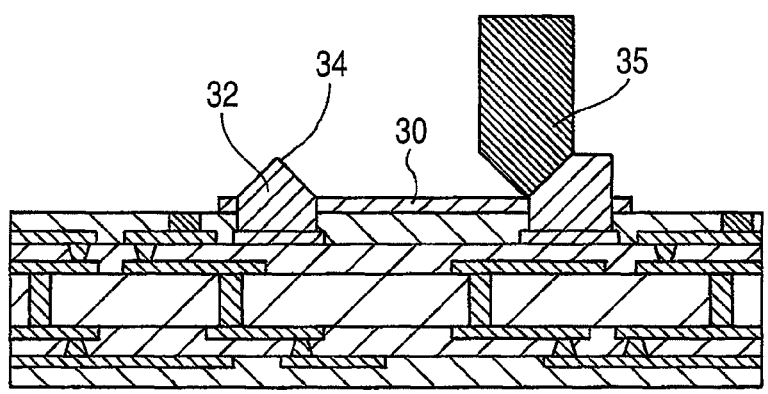
FIGS. 4A to 4D show steps of the method (second half steps) of producing the optical waveguide mounted substrate of the invention.

Referring to FIG. 4A, in each of the two projections 32, 32 of the metal (Cu), the both faces are then obliquely cut at 45 degrees by dicing with a 45-degree dicer blade 35, or by a 45-degree polishing plate to form inclined faces 34 of the metal (Cu). In the case where scratches or recesses are formed in the cut surfaces caused by dicing or the like, the cut surfaces are smoothed by using electrolytic Cu plating or Ni plating.

Figure 4B:
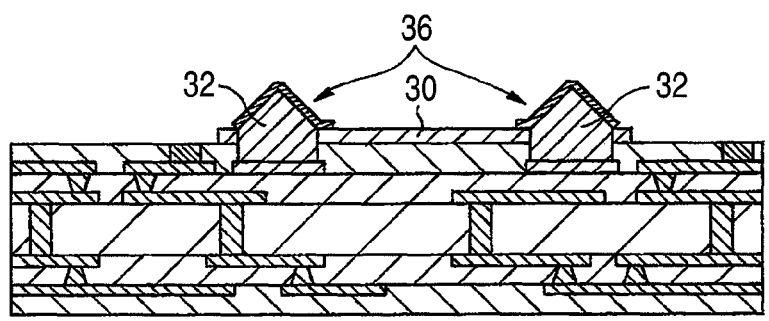
Figure 4C:
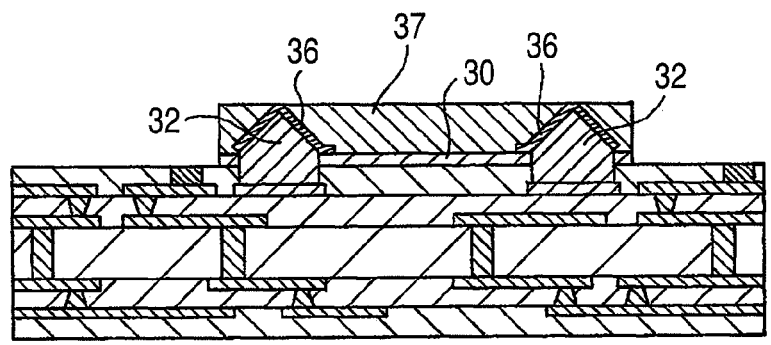
Figure 4D:
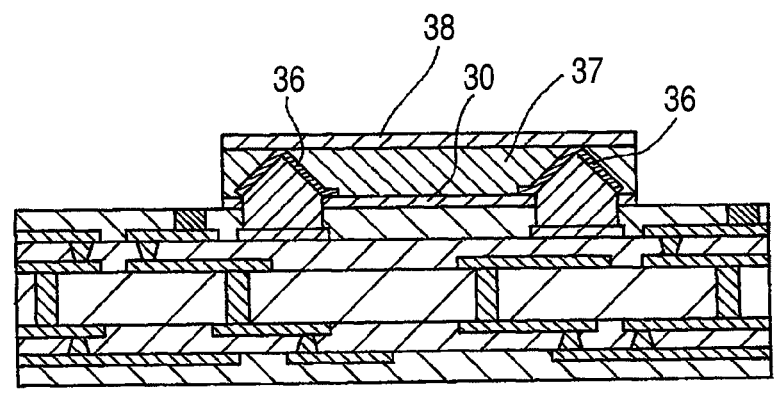

Referring to FIG. 4B, next, a metal layer 36 with a metal reflecting surface is formed as a metal mirror (reflecting mirror) 36 on the inclined faces 34 of the metal (Cu) which are inclined at 45 degrees, by metal sputtering, vapor deposition, or the like. For example, the metal layer 36 made of Au is formed on the inclined faces 34 by metal sputtering, vapor deposition, or the like, using Au, as the metal mirror 36 made of Au. Referring to FIG. 4C, a core layer 37 is then stacked on the electrical circuit substrate. A film-like material which is uncured is used as the material for forming the core and the like. A patterning process using a mask (not shown) and the like is conducted, and a developing process is performed. Since the material 37 of the core layer is uncured, flattening is conducted to an extent reaching the tip ends of the projections 32, 32.

Next, an upper cladding layer 38 is stacked on the core layer 37 and then subjected to patterning and developing. The upper cladding layer 38 has a thickness of about 10 μm. As a result, an optical waveguide mounted electrical circuit substrate which incorporates an optical waveguide is completed.

In the above-described embodiment, the metal mirror 36 is disposed in two places. However, there is a case where the metal mirror 36 is disposed only in one place as described later.

Figure 5:
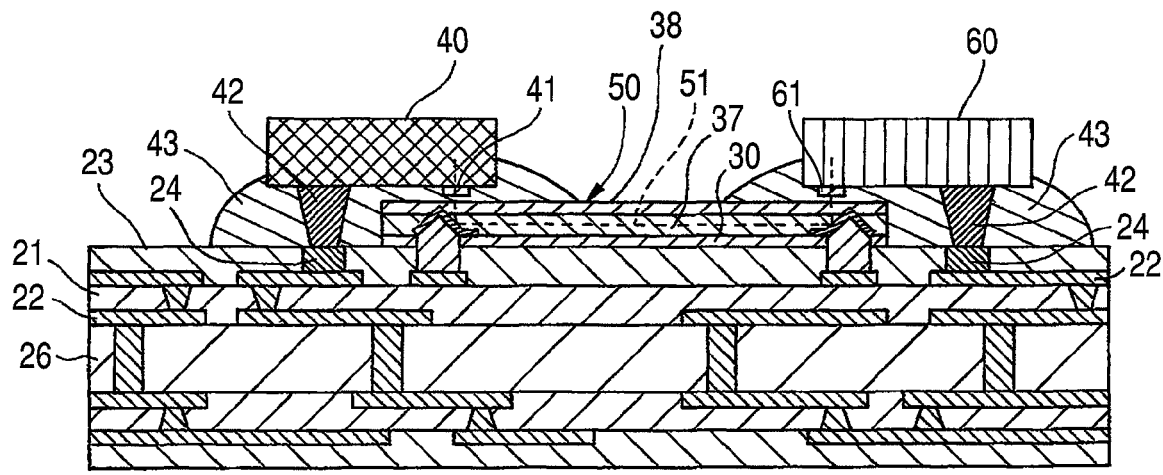
FIG. 5 shows an embodiment of the optical waveguide mounted substrate produced according to the invention.
Figure 6:
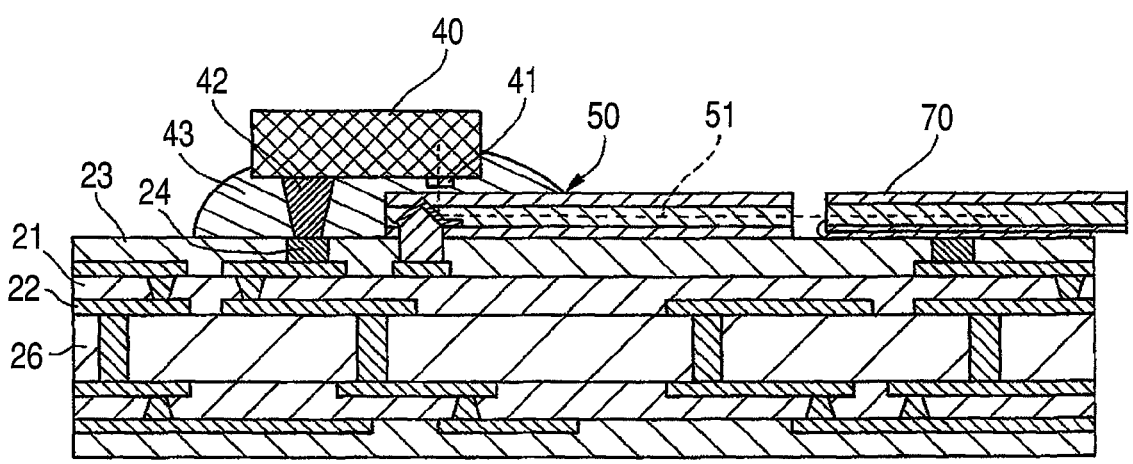
FIG. 6 shows another embodiment of the optical waveguide mounted substrate produced according to the invention.

FIG. 5 is a section view of an optical waveguide mounted substrate which is an embodiment of the optical waveguide mounted substrate of the invention produced by the steps of FIGS. 3 and 4, and which is used for transmitting optical signals due to light emission and reception on the same electrical circuit substrate. FIG. 6 is a section view of an optical waveguide mounted substrate which is another embodiment of the optical waveguide mounted substrate of the invention, and which is used for emitting (or receiving) light on an electrical circuit substrate to perform transmission of an optical signal through an optical fiber or the like.

In the embodiment shown in FIG. 5, an optical waveguide 50 is formed on the upper face of a multilayer electrical circuit substrate by the steps of FIGS. 3 and 4. In this case, as described above, the optical waveguide 50 is configured by the stacked member consisting of the lower cladding layer 30, the middle core layer 37, and the upper classing layer 38, and has the metal mirrors 36 (metal reflecting surfaces) which are inclined at 45 degrees, in the vicinities of the both ends of the optical waveguide 50 in the core layer 37. The portion of the core layer 37 between the two metal mirrors 36, 36 which are respectively on the both sides of the optical waveguide 50 define an optical path 51.

A light emitting device 40 such as a VCSEL is mounted on the upper face of the multilayer electrical circuit substrate and adjacent to one side of the optical waveguide 50. The light emitting device 40 comprises a light emitting portion 41 in the device body, and is connected to the solder lands 24 of the multilayer electrical circuit substrate by bumps 42 to be electrically connected to the substrate. The light emitting device 40 is mounted on the multilayer electrical circuit substrate by a transparent underfill material 43. In this case, the light emitting device 40 is positioned with respect to the multilayer electrical circuit substrate so that the optical axis of the light emitting portion 41 is perpendicular to the upper face of the multilayer electrical circuit substrate, and also to the optical waveguide 50 and the optical path 51, and so that the optical axis of the light emitting portion 41 forms an angle of 45 degrees with respect to the metal reflecting surface of one of the metal mirrors 36.

By contrast, a light receiving device 60 such as an PD is mounted on the upper face of the multilayer electrical circuit substrate and adjacent to the other side of the optical waveguide 50. The light receiving device 60 comprises a light receiving portion 61 in the device body, and, in the same manner as the light emitting device 40, is connected to the solder lands 24 of the multilayer electrical circuit substrate by bumps 42 to be electrically connected to the substrate. In the same manner as the light emitting device 40, the light receiving device 60 is mounted on the multilayer electrical circuit substrate by a transparent underfill material 43. In this case, the light receiving device 60 is positioned with respect to the multilayer electrical circuit substrate so that the optical axis of the light receiving portion 61 is perpendicular to the upper face of the multilayer electrical circuit substrate, and also to the optical waveguide 50 and the optical path 51, and so that the optical axis of the light receiving portion 61 forms an angle of 45 degrees with respect to the metal reflecting surface of the other of metal mirrors 36.

Therefore, light which is emitted from the light emitting portion 41 of the light emitting device 40, and which is perpendicularly incident to the optical waveguide 50 is reflected at an angle of 90 degrees by the metal reflecting surface of the one of the metal mirrors 36 to pass through the optical path 51 in the core layer 37 of the optical waveguide 50, and again reflected at an angle of 90 degrees by the metal reflecting surface of the other of the metal mirrors 36 of the optical waveguide 50, to be received by the light receiving portion 61 of the light receiving device 60.

The other embodiment shown in FIG. 6 is different from the embodiment of FIG. 5 in the following points. In the embodiment of FIG. 5, the pair of metal mirrors are disposed in the two places in the vicinities of the both ends of the optical waveguide 50, respectively. By contrast, in the embodiment of FIG. 6, the single metal mirror is disposed only in the vicinity of the one end of the optical waveguide 50, and, in place of the light receiving device 60 disposed in the embodiment of FIG. 5, an optical fiber 70 for signal transmission is placed so that the incident face of the optical fiber 70 is opposed to the other end face of the optical waveguide 50 via a small gap to make the optical axis of the optical waveguide 50 coincident with that of the optical fiber 70.

Therefore, light which is emitted from the light emitting portion 41 of the light emitting device 40, and which is perpendicularly incident to the optical waveguide 50 is reflected at an angle of 90 degrees by the metal reflecting surface of the metal mirror 36 to pass through the optical path 51 in the core layer 37 of the optical waveguide 50, and incident on the optical fiber 70 through the other end face of the optical waveguide 50, thereby performing transmission of an optical signal.

It is a matter of course that the embodiment shown in the figure may be configured so that the light emitting device 40 is replaced with a light receiving device, and light which is incident from the optical fiber 70 on the optical waveguide 50 is reflected at an angle of 90 degrees by the metal reflecting surface of the metal mirror 36 to be received by the light receiving device.

Although the embodiments of the invention have been described with reference to the accompanying drawings, the invention is not restricted to the embodiments, and various forms, modifications, changes, and the like may be possible within the spirit or scope of the invention. For example, in the embodiment the metal mirror is inclined at 45 degree; however, the inclined angle of the metal mirror is not limited to 45 degree. Further, the projection 32 is made of Cu and the metal mirror 36 is made of Au; however, the material of the projection 32 and the metal mirror 36 are not limited to these metals.

As described above, according to the invention, an optical waveguide can be formed on an electrical circuit substrate as extension of the production of the electrical circuit substrate, and the electrical circuit substrate and the optical waveguide, which are separately produced in a related-art opto-electrical circuit substrate, can be collectively produced in extension of the production of the electrical circuit substrate, so that the number of man-hours and the production cost can be reduced. Therefore, the invention can be applied to all kinds of substrates for optical signal transmission, such as a consolidated package of optical and electrical components, and a consolidated substrate of optical and electrical components.

What is claimed is:

1. A method of producing an optical waveguide mounted substrate comprising an electrical circuit substrate and an optical waveguide formed on the electrical circuit substrate, the electrical circuit substrate having an insulating layer positioned at its surface and a conductor layer below the insulating layer, the method comprising steps of:
   forming at least one opening in the insulating layer to expose the conductor layer;
   forming a lower cladding layer on the insulating layer, the lower cladding layer having an opening at a position corresponding to the opening of the insulating layer;
   forming a resist layer on the lower cladding layer, and forming an opening at a position of the resist layer corresponding to the opening of the insulating layer;
   performing electrolytic plating with using the conductor layer which is exposed through the openings, as an electrode, to fill the openings with a metal, the openings passing through the insulating layer, the lower cladding layer, and the resist layer;
   removing the resist layer to form a projection configured by the filled metal;
   processing the projection to have an inclined face;
   forming a reflecting layer on the inclined face of the projection;
   stacking a core layer on the lower cladding layer and the reflecting layer; and
   stacking an upper cladding layer on the core layer.

2. A method of producing an optical waveguide mounted substrate according to claim 1, wherein the projection is formed by the electrolytic plating using Cu, the reflecting layer is formed by Au, and the inclined face of the projection is processed into an angle of 45 degrees to a surface of the electrical circuit substrate.

3. An optical waveguide mounted substrate comprising:
   an electrical circuit substrate; and
   an optical waveguide formed on the electrical circuit substrate,
   wherein the optical waveguide includes
      a lower cladding layer formed on a surface of the electrical circuit substrate,
      a core layer stacked on the lower cladding layer,
      an upper cladding layer stacked on the core layer, and
      at least one inclined reflecting mirror formed in the core layer, the reflecting mirror having a metal layer formed on an inclined face of a projection made of metal formed in the optical waveguide, the metal layer being made of different metal from the projection.

4. An optical waveguide mounted substrate according to claim 3, wherein the reflecting mirror is inclined at 45 degrees to the optical waveguide.

5. An optical waveguide mounted substrate according to claim 4, wherein the reflecting mirror comprises two reflecting mirrors disposed in the vicinities of both ends of the optical waveguide.

6. An optical waveguide mounted substrate according to claim 4, wherein the reflecting mirror is disposed only in the vicinity of one end of the optical waveguide.

7. An optical waveguide mounted substrate according to claim 5, further comprising:
  a light emitting device having a light emitting portion and being disposed on the electrical circuit substrate; and
  a light receiving device having a light receiving portion and being disposed on the electrical circuit substrate,
  wherein an optical axis of the light emitting portion is perpendicular to an optical path defined by the upper and lower cladding layers of the optical waveguide, and the optical axis of the light emitting portion forms an angle of 45 degrees with respect to one of the reflecting mirrors, and
  wherein an optical axis of the light receiving portion is perpendicular to the optical path of the optical waveguide, and the optical axis of the light receiving portion forms an angle of 45 degrees with respect to the other of the reflecting mirrors.

8. An optical waveguide mounted substrate according to claim 6, further comprising:
  a light emitting device having a light emitting portion and being disposed on the electrical circuit substrate,
  wherein an optical axis of the light emitting portion is perpendicular to an optical path defined by the upper and lower cladding layers of the optical waveguide, and the optical axis of the light emitting portion forms an angle of 45 degrees with respect to the reflecting minor.

9. A method of producing an optical waveguide mounted substrate according to claim 3, wherein the metal layer is made of Au, and the projection is made of Cu.

* * * * *